United States Patent
Wu

[11] Patent Number: 6,020,240
[45] Date of Patent: Feb. 1, 2000

[54] METHOD TO SIMULTANEOUSLY FABRICATE THE SELF-ALIGNED SILICIDED DEVICES AND ESD PROTECTION DEVICES

[75] Inventor: Shye-Lin Wu, Hsinchu, Taiwan

[73] Assignee: Texas Instruments-Acer Incorporated, Hsinchu, Taiwan

[21] Appl. No.: 09/056,222

[22] Filed: Apr. 7, 1998

[51] Int. Cl.[7] ...................... H01L 21/8234; H01L 21/336
[52] U.S. Cl. ........................... 438/275; 438/281; 438/592
[58] Field of Search .................................. 438/275, 281, 438/592

[56] References Cited

U.S. PATENT DOCUMENTS

| | | | |
|---|---|---|---|
| 5,374,565 | 12/1994 | Hsue et al. | 437/30 |
| 5,585,299 | 12/1996 | Hsu | 437/56 |
| 5,672,527 | 9/1997 | Lee | 437/41 |
| 5,723,352 | 3/1998 | Shih et al. | 437/44 |

OTHER PUBLICATIONS

K. Fujii et al., A Thermally Stable Ti–W Salicide for Deep–Submicron Loic with Embedded DRAM, 1996 IEEE, pp. 451–454 no month.

Ajith Amerasekera et al., Correlating Drain Junction Scaling, Salicide Thickness, and Lateral NPN Behavior, with the ESD/EOS Performance of a 0.25 μm CMOS Process, 1996 IEEE, pp. 893–896 no month.

Shye Lin Wu et al., Characterization of Thin Textured Tunnel Oxide Prepared by Thermal Oxidation of Thin Polysilicon Film on Silicon, IEEE Transactions on Electron Devices, vol. 43, No. 2, Feb. 1996, pp. 287–294.

*Primary Examiner*—John F. Niebling
*Assistant Examiner*—Alexander G. Ghyka
*Attorney, Agent, or Firm*—Harness, Dickey & Pierce, P.L.C.

[57] ABSTRACT

The present invention discloses a method to simultaneously fabricate the self-aligned silicided devices and ESD protective devices in a substrate. A functional region and a ESD protective region are defined on the substrate and each region has a gate structure. Firstly, lightly doped drain (LDD) regions are formed in both of the region by an ion implantation process. An N-type conducting dopants are implanted into the ESD protective region. Afterwards, the spacers of the gate structures are defined for isolation. A thermal oxidation process is done to grow a thin pad oxide on the functional region and a thicker pad oxide on the ESD protective region. A blanket implantation is performed on all NMOS device. After the implantation process, a RTP process is done to activate the dopants in the substrate and to recover implant damages. Finally, the thin pad oxide layer is removed by using a wet etching process and a self-aligned silicide layers are defined on the gate, source and drain regions of the functional region.

19 Claims, 5 Drawing Sheets

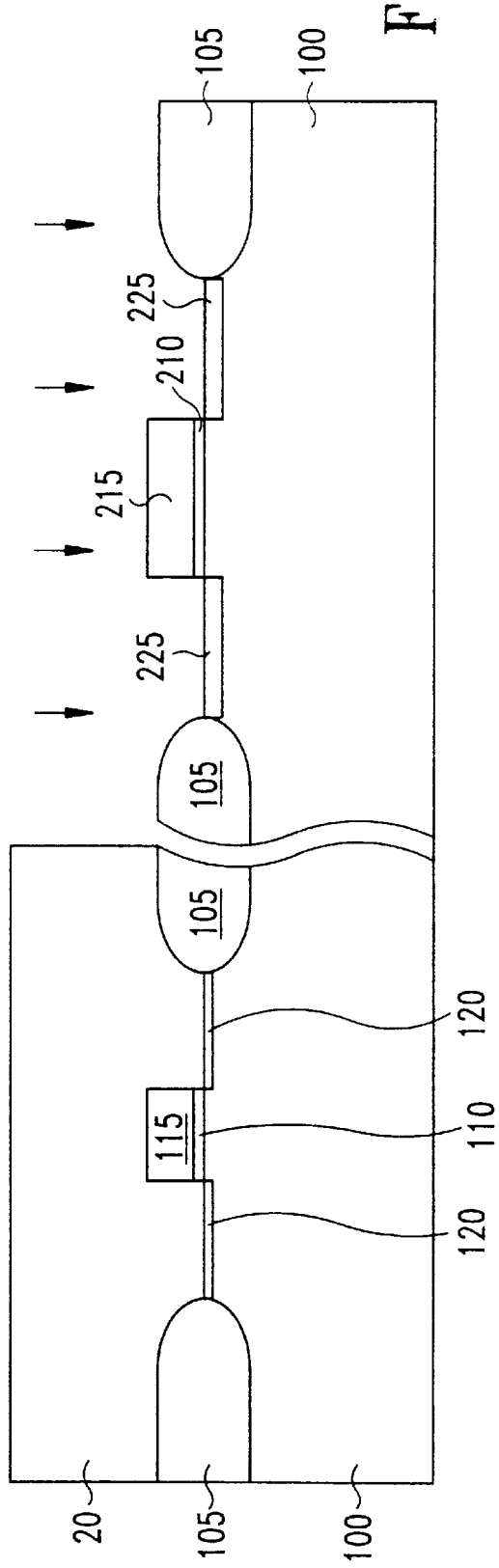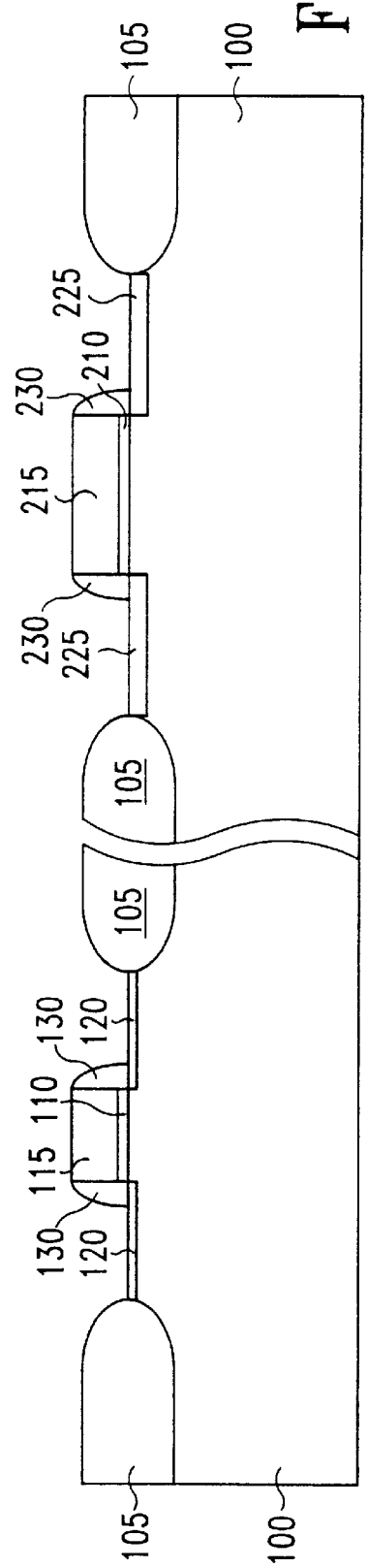

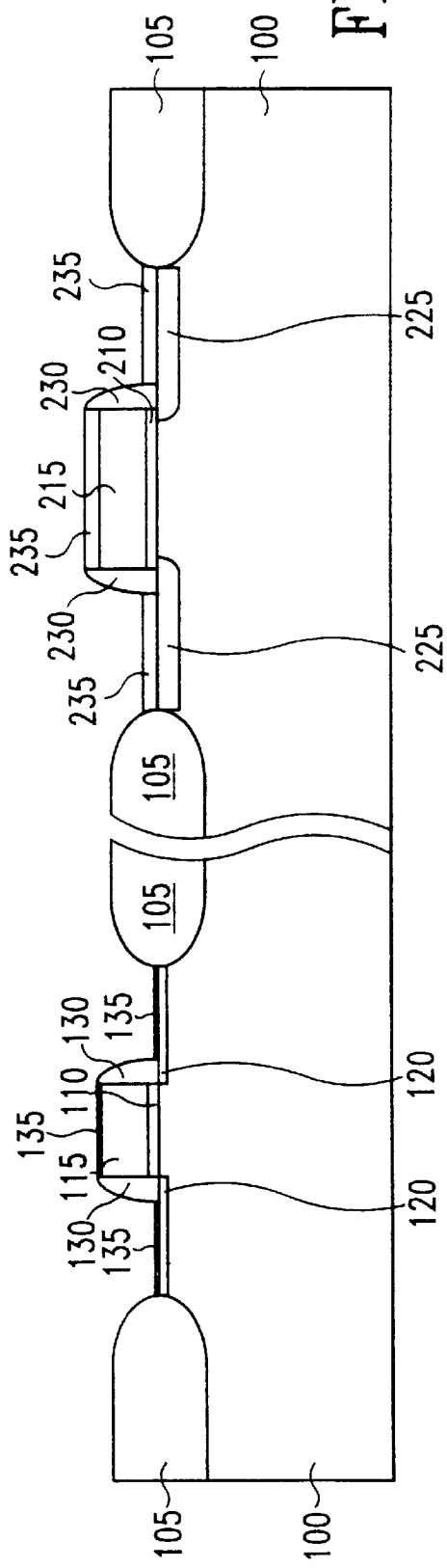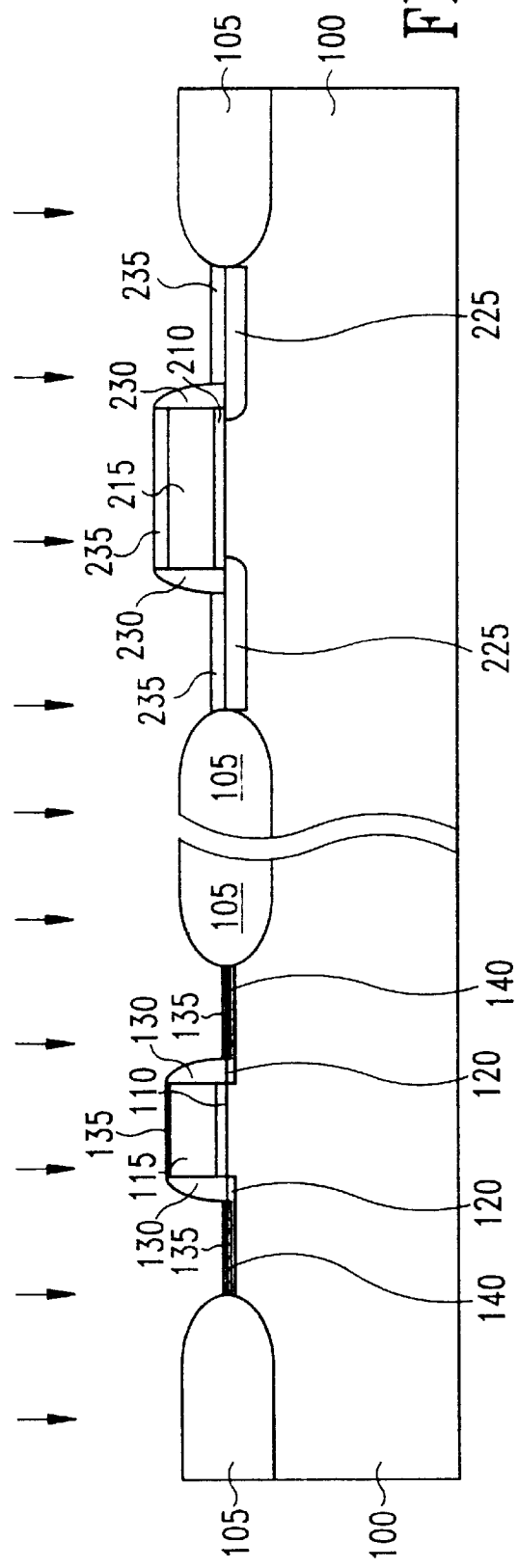

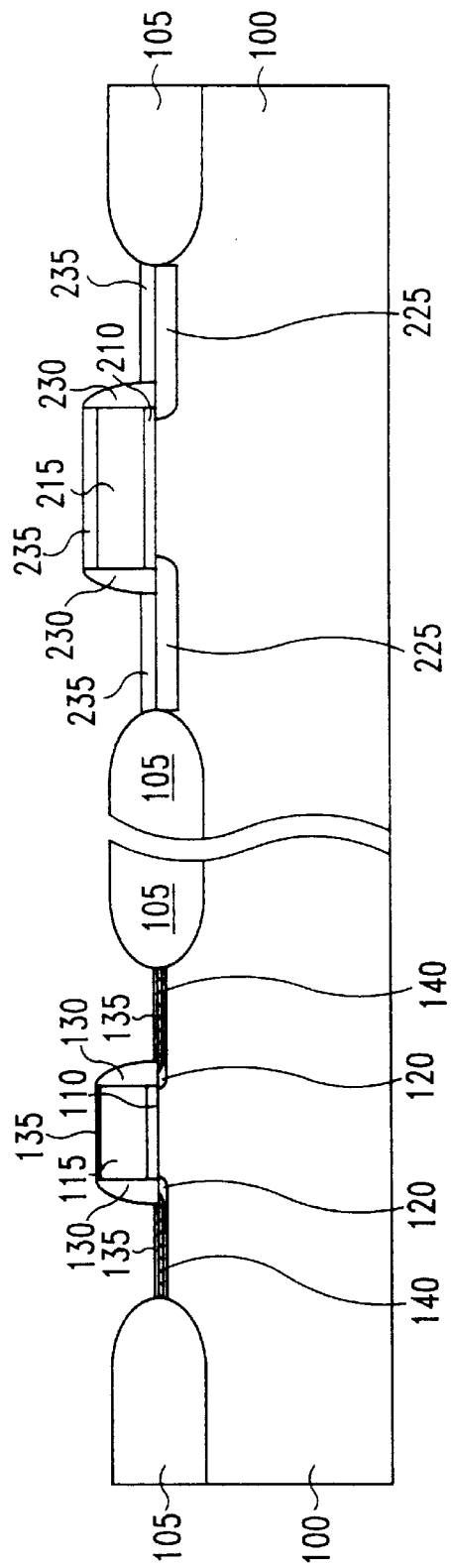
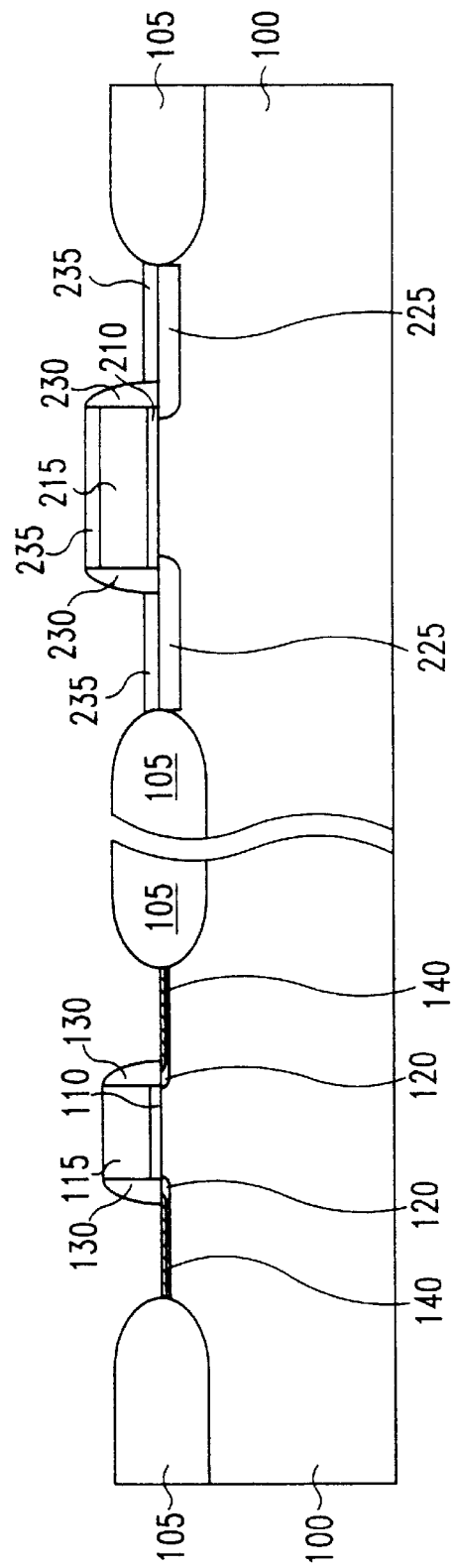

METHOD TO SIMULTANEOUSLY FABRICATE THE SELF-ALIGNED SILICIDED DEVICES AND ESD PROTECTION DEVICES

FIELD OF THE INVENTION

The present invention relates to a method of manufacturing self-aligned silicided devices, and more specifically, to a method of manufacturing simultaneously the self-aligned silicided devices and the electrostatic discharge (ESD) devices on a substrate.

BACKGROUND OF THE INVENTION

Ultra large-scale integrated (VLSI) circuits with high performance are demanded in order to lower the power consumption and to increase integration of the devices on a wafer. Salicided process is one of the most popular technique for improving the operation speed for ULSI devices. This is due to the fact that the salicided devices have a lower contact resistance than the non-salicided devices, as reference to IEDM Tech. Dig. page 451, 1996, entitled "A Thermally Stable Ti—W salicide for Deep-Submicron Logic with Embedded DRAM".

According to the above article, the devices with salicided process have a faster operation speed and a better short channel effect than devices with conventional technique. However, the devices with a self-aligned silicided contact shows a worse electrostatic shielding discharge (ESD) performance than the non-salicided devices. As is described as below descriptions in detail, using salicide process have great influence on the performance of devices.

The relation between self-aligned silicide process and the ESD capability was studied in a article, entitled "Correlating Drain Junction Scaling, Salicide Thickness, and Lateral NPN behavior, with the ESD/EOS performance of a 0.25 $\mu$m CMOS Process", as reference to IEDM Tech. Dig., p. 893, 1996. The authors discussed about that the current gain of a self-biased lateral NPN transistor was affected by the salicide thickness in a 0.25 $\mu$m CMOS process, and the relationship between the current gain and the ESD performance was examined. The current gain was strongly influenced by the effective drain/source diffusion depth below the salicide, which was determined by the implant energy and the amount of the active diffusion consumed in silicidation. The devices with lower current gain are found to have lower ESD capability. The current gain was affected by the NMOS drain junction property so that the ESD performance could be enhanced by either increasing the drain/source implant energy or reducing the salicide thickness. Neither the increase of the implant energy nor the decrease of salicide thickness significantly changed the NMOS characteristic.

A method to fabricate an electrostatic discharge protection circuit is disclosed in U.S. Pat. No. 5,672,527 which was filed on Mar. 8, 1996. The inventors of the patent proposed a method with a photomask instead of several masks as in a conventional process during the salicide process of ESD circuits. However, a complicating etching process was used for accomplishing the salicide process, the devices could be degraded from the etching process. Many stages are used to simultaneously fabricate ESD devices and MOS devices on a substrate in the patent so that the devices have a long processing time and a difficult processing flow.

As stated above, a salicide process for MOS devices without complicated etching process is needed and the ESD performance of the circuits of the MOS devices is not affected by the salicide process.

SUMMARY OF THE INVENTION

A method to simultaneously manufacture the self-aligned silicided devices and electrostatic discharge (ESD) protection devices on a substrate is disclosed in the present invention. Field oxide regions are fabricated in a silicon substrate for isolation, and a functional region and an ESD protective region are defined between the field oxide regions. Gate structures are constructed on the functional region and the ESD protective region. Afterwards, an N-type ion implantation is used to form lightly doped drain (LDD) regions on the function region and the ESD protective region. An N-type ion implantation is performed again on the ESD protective region to form source/drain regions in the substrate. The spacers are then formed on the sidewall of the gate structure. A thermal oxidation process is done to grow a thin pad oxide layer on the functional region and a thicker pad oxide layer on the ESD protective region. A high-dose and low-energy implantation is used to form the gate, source and drain regions on both of the regions. A RTP process is done to activate the dopants in the substrate and to recover implant damages. After the last RTP process, the thin pad oxide layer is removed by using a wet etching process containing diluted HF solution. Finally, a self-aligned silicide layer is formed on the functional region.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 3 shows the formation of an N-type doped region in the ESD protective device in accordance with the present invention;

FIG. 4 shows the formation of the spacers of the gate structure in accordance with the present invention;

FIG. 5 shows that a silicon oxide layer is conformally deposited on the device's region in accordance with the present invention;

FIG. 6 shows that an ion implantation is performed to implant ions into the active regions of the devices in accordance with the present invention;

FIG. 7 shows that a rapid thermal annealing process is implemented to activate the dopants and recover implant damages in accordance with the present invention;

FIG. 8 shows the etching of a pad oxide layer in the functional device in accordance with the present invention;

DETAILED DESCRIPTION OF THE PREFERRED EMBODIMENT

The present invention discloses a method to simultaneously fabricate the self-aligned silicided devices and electrostatic discharge (ESD) protection device on a substrate. It is noted that a method to form an ESD protection circuit during salicide process of a MOS device without several masks or a complicated etching process in the present invention.

Figure 1:
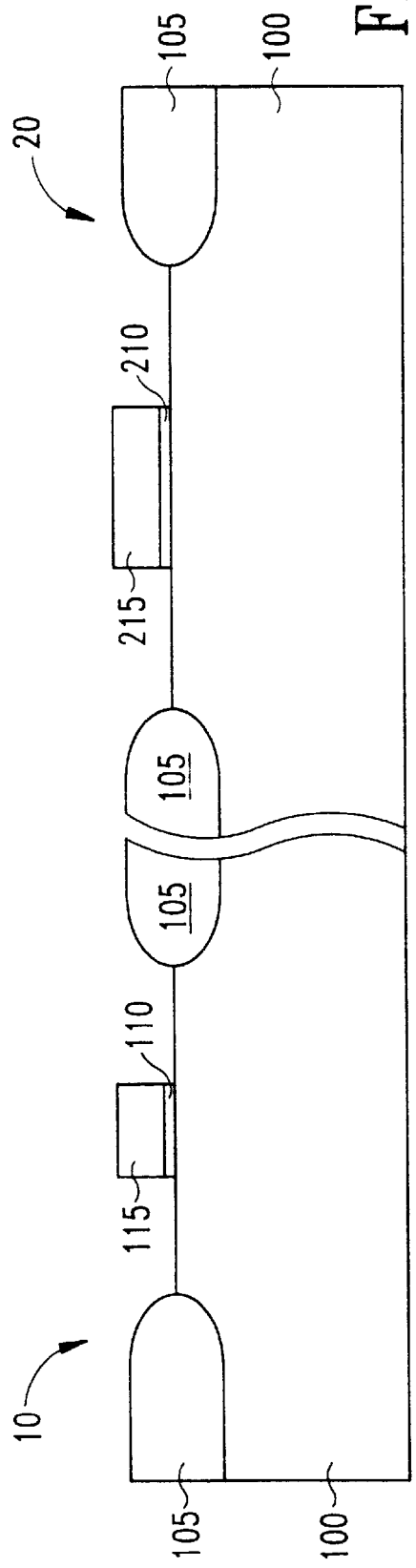
FIG. 1 shows a cross sectional view of a substrate having a functional device and an ESD protective device, each of the devices having a gate structure in accordance with the present invention.

Referring to FIG. 1, a cross sectional view of a substrate 100 is demonstrated. Field oxide regions 105 are formed for isolation in the substrate 100 and it has a thickness between about 3000 to 8000 angstroms. Between the field oxide regions 105, a functional region 10 and an ESD protective region 12 are defined on the substrate 100. The functional region 10 is use to be a region for logic circuits or peripheral circuits of integrated circuits. There are a thin gate oxide 110 and a gate 115 on the functional device 10 and there are a thin gate oxide 210 and a gate 215 on the ESD protective device 20.

Figure 2:
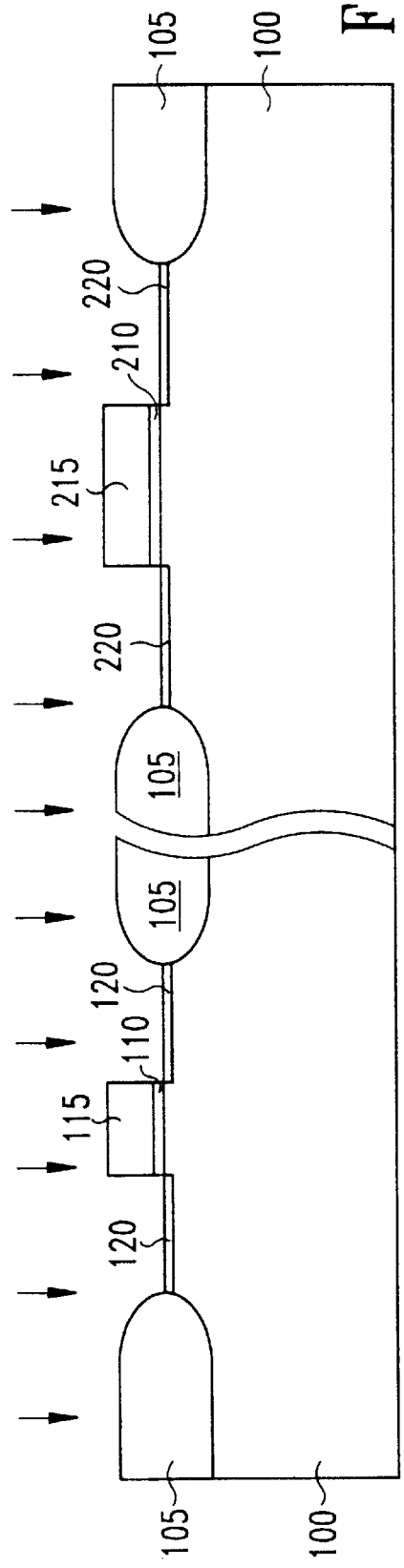
FIG. 2 shows the formation of an N-type light doped drain in the functional device and the ESD protective device in accordance with the present invention.

Turning to FIG. 2, a blanket implantation containing N-type conducting dopant is performed to form an N-type lightly doped drain (LDD) region 120 and region 220 in the functional device 10 and the ESD protective device 12, respectively. The dopant of the ion implantation is typically formed of arsenic ion or phosphorus ion. The implantation process has a preferred energy between about 5 to 80 KeV and a preferred dose between about $5 \times 10^{12}$ to $5 \times 10^{14}$ ions/cm$^2$.

Turning to FIG. 3, the source/drain implantation, containing N-type conducting dopants, of the ESD protective device 12 is done to form a source/drain region 225. During the implantation of the ESD protective region 12, a photoresist layer 20 is covered on the functional region 10 to serve as the mask of the implantation process. The implantation for ESD protective region 12 is performed with a high dose between about $5 \times 10^{14}$ to $5 \times 10^{16}$ ions/cm$^2$, at energy between about 0.5 to 120 KeV. In order to just implant ions into the ESD protective region 12, a photoresist layer 20 is defined on the functional region 10 by using a photolithography process.

Turning to FIG. 4, a silicon oxide layer is deposited on the substrate 100 by using conventional technique and it is then etched back to form the spacer 130 and the spacer 230.

Turning to FIG. 5, a pad oxide layer 135 and a pad oxide layer 235 is formed over the source, drain and gate region of the functional region 10 and the ESD protective region 12, respectively, by using a low-temperature steam oxidation process in an oxygen ambient.

According to a paper of S. L. Wu et al for "Characterization of Thin Textured Tunnel Oxide Prepared by Thermal Oxidation of Thin Polysilicon Film on Silicon", which was published in IEEE Trans. Electron Devices, it is noted that the oxidation rate of a semiconductor substrate depends on the doping level of the substrate in FIG. 3 according to the article. The oxidation rate of a n$^+$heavy doping substrate is much faster than that of a low doping substrate. Besides, the oxidation rate of the normal oxide increased drastically as the As$^+$implanted dosage is larger than $5 \times 10^{15}$ /cm$^2$. Thus, the pad oxide layer 235 is much thicker than the pad oxide layer 135.

Turning to FIG. 6, a high-dose and low-energy ion implantation containing N-type conducting dopants is performed to implant ions into the source, drain and gate region of the devices. After the ion implantation process, the source/drain regions 140 are formed in the functional region 10. The N-type dopant, which is implanted into the source/drain regions 140, is typically arsenic or phosphorus ions and it is implanted with a high dosage between about $5 \times 10^{14}$ to $5 \times 10^{16}$ ions/cm$^2$, at an energy between about 0.5 to 80 KeV.

Turning to FIG. 7, a rapid thermal annealing (RTA) process is performed to activate the dopants and recover implant damages. In a case, the RTA process is done at a temperature between about 750 to 1050 degrees centigrade.

Turning to FIG. 8, the thin pad oxide layer 135 in the functional region 10 is removed by diluted HF solution or buffer oxide etching (BOE) solution. Since the oxide thickness of the ESD protective region is much larger than that of the functional region, there exists an oxide layer on the source, drain and gate regions after the diluted HF solution treatment.

Figure 9:
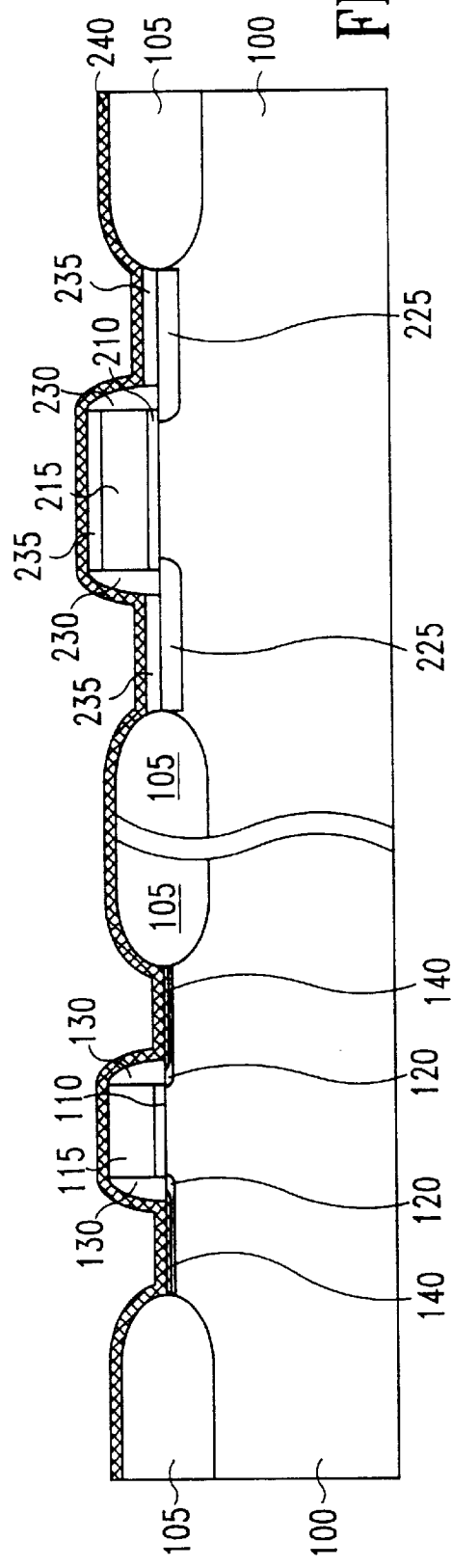
FIG. 9 shows that a refractory or noble metal is sputtered on entire region in accordance with the present invention.

Turning to FIG. 9, a refractory or noble metal layer 240 is sputtered on all regions. In a preferred embodiment, the metal layer 240 is selected from a group of Ti, W, Co, Ni, Cr, Pd and Pt, etc.

Figure 10:
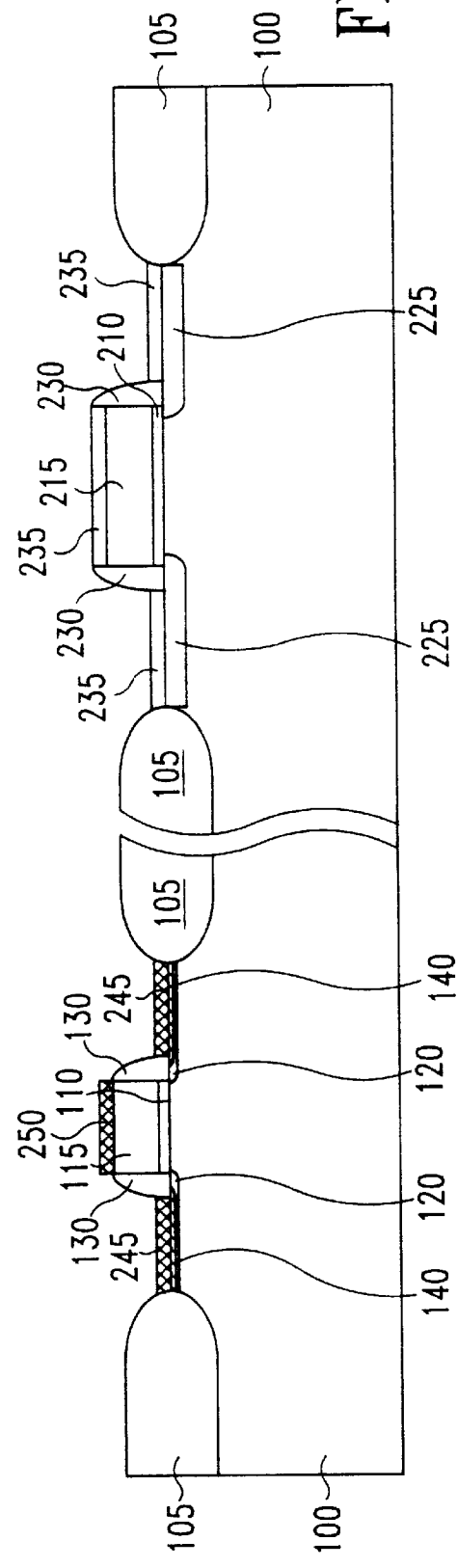
FIG. 10 shows the formation of a salicide layer on the functional device in accordance with the present invention.

After the deposition of the metal layer 240, a two-step RTA process is performed to form a salicide layer 245 on the source/drain regions 140 and the gate 115, as illustrated in FIG. 10. In a preferred embodiment, the first-step of the RTA process is done at a temperature between about 300 to 700 degrees centigrade and the second step of the RTA process has an annealing temperature between about 750 to 1050 degrees centigrade. After the first-step RTA process, the unreacted metal layer 240 is removed in a room temperature mixture of DI H$_2$O, H$_2$O$_2$ and NH$_4$OH solution, a second RTA process is used to lower the sheet resistance of the salicide layer 145.

There are three benefits in the present invention. The first benefit is that the circuit operation speed could be significantly improved due to the functional device having a self-aligned silicide contact and an ultra-shallow junction. The second benefit is that the higher ESD protective voltage could be obtained due to non-salicide contact. The third benefit is that the proposed recipe is simpler than the prior art that is described in U.S. Pat. No. 5,672,527.

While the preferred embodiment of the invention has been illustrated and described, it will be appreciated that various changes can be made therein without departing from the spirit and scope of the invention.

What is claimed is:

1. A method to manufacture a self-aligned silicided device and a ESD protection device on a substrate, said method comprising steps of:

providing a substrate having a function region and an electrostatic discharge (ESD) protective region, each said region having a gate structure;

performing a first ion implantation containing N-type conducting dopants to form light doped drain (LDD) regions in said functional region and said ESD protective region;

performing a second ion implantation containing N-type conducting dopants on said ESD protective region to form source/drain regions;

forming spacers of said gate structure of said functional region and said ESD protective region;

performing a thermal oxidation process to form pad oxide layers on said source/drain and gate regions of said functional region and said ESD protective region;

performing a third implantation containing N-type conducting dopants to form source, drain and gate regions of said functional region and said ESD protective region;

performing a rapid thermal annealing (RTA) process to activate dopants in said substrate and to recover implant damages;

removing said pad oxide layer on said functional region;

forming a metal layer over said substrate; and performing a salicide process to form a salicide layer on said gate, source and drain regions of said functional region.

2. The method of claim 1, wherein said salicide process comprising steps of:

performing a first RTA process to form said salicide layer on said functional region;

removing said unreacted metal layer by using a wet etching process; and performing a second RTA process.

3. The method of claim 2, wherein said first RTA process is done at a temperature between about 300 to 700 degrees centigrade.

4. The method of claim 2, wherein said unreacted metal layer is removed by using a wet etching process containing a mixture of DI $H_2O$, $H_2O_2$ and $NH_4OH$ as a etcher.

5. The method of claim 2, wherein said second RTA process is performed at a temperature between about 750 to 1050 degree centigrade.

6. The method of claim 1, wherein said first ion implantation is done by using Phosphorus or Arsenic ion, at a dosage about $5 \times 10^{12}$ to $5 \times 10^{14}$ ions/cm$^2$, at an energy between about 5 to 80 KeV.

7. The method of claim 1, wherein said second ion implantation is done with a dosage between about $5 \times 10^{14}$ to $5 \times 10^{16}$ /cm$^2$, at an energy between about 0.5 to 120 KeV.

8. The method of claim 1, wherein said third ion implantation is done with a dosage between about $5 \times 10^{14}$ to $5 \times 10^{16}$ ions/cm$^2$, at an energy between about 0.5 to 80 KeV.

9. The method of claim 1, wherein said RTP process is performed at a temperature between about 750 to 1050 degrees centigrade.

10. The method of claim 1, wherein said pad oxide layer on said functional region is removed by using a wet etching process with a diluted HF solution or buffer oxide etching (BOE) solution.

11. The method of claim 1, wherein said metal layer is selected from a group consisting of Ti, W, Co, Ni, Cr, Pd and Pt.

12. A method to manufacture self-aligned silicided devices and ESD protection devices on a substrate, said method comprising steps of:

providing a substrate having a function region and a ESD protective region, each said region having a gate structure;

performing a first ion implantation containing N-type conducting dopants to form light doped drain (LDD) regions in said functional region and said ESD protective region;

performing a second ion implantation containing N-type conducting dopants on said ESD protective region to form source/drain regions;

forming spacers of said gate structure of said functional region and said ESD protective region;

performing a thermal oxidation process to form pad oxide layers on said source/drain and gate regions of said functional region and said ESD protective region;

performing a third implantation containing N-type conducting dopants to form source, drain and gate regions of said functional region and said ESD protective region;

performing a first rapid thermal annealing (RTA) process to activate dopants in said substrate and to recover implant damages;

removing said pad oxide layer in said functional region;

forming a metal layer over said substrate;

performing a second RTA process to form said salicide layer on said functional region;

removing said unreacted metal layer by using a wet etching process; and performing a third RTA process.

13. The method of claim 12, wherein said first RTP process is performed at a temperature between about 750 to 1050 degrees centigrade.

14. The method of claim 12, wherein said second RTA process is done at a temperature between about 300 to 700 degrees centigrade.

15. The method of claim 12, wherein said third RTA process is performed at a temperature between about 750 to 1050 degree centigrade.

16. The method of claim 12, wherein said first ion implantation is done by using Phosphorus or Arsenic ion, at a dosage about $5 \times 10^{12}$ to $5 \times 10^{14}$ ions/cm$^2$.

17. The method of claim 12, wherein said second ion implantation is done with a dosage between about $5 \times 10^{14}$ to $5 \times 10^{16}$ ions/cm$^2$, at an energy between about 0.5 to 120 KeV.

18. The method of claim 12, wherein said third ion implantation is done with a dosage between about $5 \times 10^{14}$ to $5 \times 10^{16}$ ions/cm$^2$, at an energy between about 0.5 to 80 KeV.

19. The method of claim 12, wherein said pad oxide layer of said protective region is thicker than that of said functional region.

* * * * *